(12) United States Patent
Tang

(10) Patent No.: US 10,422,834 B2
(45) Date of Patent: Sep. 24, 2019

(54) METHOD AND SYSTEM FOR ITERATIVELY DETERMINING WITH IMPROVED ACCURACY A STATE OF CHARGE OF A BATTERY HAVING A NUMBER OF CELLS

(71) Applicant: Corvus Energy Inc., Richmond (CA)

(72) Inventor: Siu Lun Isaac Tang, Richmond (CA)

(73) Assignee: CORVUS ENERGY INC., Richmond, BC (CA)

(\*) Notice: Subject to any disclaimer, the term of this patent is extended or adjusted under 35 U.S.C. 154(b) by 291 days.

(21) Appl. No.: 14/995,898

(22) Filed: Jan. 14, 2016

(65) Prior Publication Data
US 2016/0202325 A1 Jul. 14, 2016

Related U.S. Application Data

(60) Provisional application No. 62/103,375, filed on Jan. 14, 2015.

(51) Int. Cl.
*G01R 31/36* (2019.01)
*G01R 31/367* (2019.01)
(Continued)

(52) U.S. Cl.
CPC ....... *G01R 31/367* (2019.01); *G01R 31/3648* (2013.01); *G01R 31/382* (2019.01); *G01R 31/3842* (2019.01); *G01R 31/396* (2019.01)

(58) Field of Classification Search
CPC ............ G01R 31/3651; G01R 31/3648; G01R 31/3624; G01R 31/3658; G01R 31/3606
(Continued)

(56) References Cited

U.S. PATENT DOCUMENTS

| 3,971,980 A | 7/1976 | Jungfer et al. |
| 4,377,787 A | 3/1983 | Kikuoka et al. |

(Continued)

FOREIGN PATENT DOCUMENTS

| DE | 102011017113 A1 | 10/2012 |
| WO | 2013173604 A1 | 11/2013 |
| WO | 2013173610 A1 | 11/2013 |

OTHER PUBLICATIONS

Plett, "Extended Kalman Filtering for Battery Management Systems of Lipb-Based HEV Battery Packs: Parts 1. Background", Journal of Power Source, Feb. 26, 2014, pp. 252-292, 134, Elsevier B.V.
(Continued)

*Primary Examiner* — Gene N Auduong
(74) *Attorney, Agent, or Firm* — Pepper Hamilton LLP

(57) ABSTRACT

A method and system for iteratively determining state of charge (SOC) of a battery cell ("selected cell") using a controller. For each of the iterations, the controller determines determine a predicted SOC of the selected cell; determines a predicted error covariance of the predicted SOC; and updates the predicted SOC and the predicted error covariance for use in subsequent iterations of the method. The updated SOC is treated as the SOC of the selected cell for that iteration of the method. Cell voltage used to determine the updated SOC may be low-pass filtered prior to its use. When the selected cell is one of multiple cells in a battery pack, the selected cell may be selected to have the lowest SEV of the cells in the pack. The error covariance may also vary directly with pack current magnitude to model inaccuracies that generally directly vary with current flow.

16 Claims, 6 Drawing Sheets

(51) Int. Cl.
*G01R 31/382* (2019.01)
*G01R 31/396* (2019.01)
*G01R 31/3842* (2019.01)

(58) Field of Classification Search
USPC .................................................. 702/63–65
See application file for complete search history.

(56) References Cited

U.S. PATENT DOCUMENTS

| | | | |
|---|---|---|---|
| 6,359,419 B1 | 3/2002 | Verbrugge et al. | |
| 6,534,954 B1* | 3/2003 | Plett | G01R 31/3651 320/132 |
| 6,789,026 B2* | 9/2004 | Barsoukov | G01R 31/3651 320/104 |
| 6,832,171 B2* | 12/2004 | Barsoukov | G01R 31/3662 320/132 |
| 6,845,332 B2 | 1/2005 | Teruo | |
| 7,136,762 B2 | 11/2006 | Ono | |
| 7,969,120 B2 | 6/2011 | Plett | |
| 8,207,706 B2 | 6/2012 | Ishikawa | |
| 8,269,502 B2 | 9/2012 | Desprez et al. | |
| 8,441,262 B2* | 5/2013 | Minarcin | B60L 11/1857 324/427 |
| 8,519,675 B2 | 8/2013 | Plett | |
| 8,635,037 B2 | 1/2014 | Quet | |
| 2014/0244193 A1* | 8/2014 | Balasingam | G06F 17/5036 702/63 |
| 2014/0278167 A1* | 9/2014 | Frost | G01R 31/3624 702/63 |
| 2014/0278170 A1* | 9/2014 | Baruzzi | G01R 31/3662 702/63 |
| 2016/0084913 A1* | 3/2016 | Lupo | G01R 31/3624 702/63 |

OTHER PUBLICATIONS

Plett, "Extended Kalman Filtering for Battery Management Systems of Lipb-Based HEV Battery Packs: Parts 2. Modeling and Identification", Journal of Power Source, Feb. 26, 2014, pp. 252-292, 134, Elsevier B.V.

Plett, "Extended Kalman Filtering for Battery Management Systems of Lipb-Based Hev Battery Packs: Part 3. State and Parameter Estimation", Journal of Power Source, Feb. 26, 2014, pp. 277-261, 134, Elsevier B.V.

Zhong et al., "A Method for the Estimation of the Battery Pack State of Charge Based on In-Pack Cells Uniformity Analysis", Journal, Aug. 3, 2013, pp. 558-564, Elsevier B.V.

Junping et al., "An Adaptive Kalman Filtering Based State of Charge Combined Estimator for Electric Vehicle Battery Pack", Journal, Aug. 21, 2009, pp. 3182-3186, Elsevier B.V.

Piller et al., "Methods for State-Of-Charge Determination and Their Applications", Journal, Jan. 10, 2001, pp. 113-120, Elsevier B.V.

* cited by examiner

METHOD AND SYSTEM FOR ITERATIVELY DETERMINING WITH IMPROVED ACCURACY A STATE OF CHARGE OF A BATTERY HAVING A NUMBER OF CELLS

This application claims the benefit of U.S. Provisional Patent Application Ser. No. 62/103,375 filed Jan. 14, 2015, which is herein incorporated by reference.

FIELD

The present disclosure is directed at methods, systems, and techniques for iteratively determining state of charge of a battery cell.

BACKGROUND

Lithium ion batteries enjoy several advantages over batteries that use more established battery chemistries, such as lead acid and nickel metal hydride batteries. For example, lithium ion batteries have relatively high energy and power densities, which permit a lithium ion battery of a certain capacity to be smaller than its lead acid or nickel metal hydride counterpart. However, lithium ion batteries also suffer from some disadvantages when compared to those more established battery chemistries. For example, lithium ion batteries should not be overcharged or undercharged as improper charging can result in sub-optimal power output, shortened battery lifespan, and damage to the batteries' cells. Research and development is ongoing into methods, systems, and techniques for ameliorating the disadvantages associated with lithium ion batteries.

SUMMARY

According to a first aspect, there is provided a method for iteratively determining state of charge (SOC) of a battery cell ("selected cell"), the method comprising using a controller to perform a number of iterations, wherein each of the iterations comprises using the controller to determine a predicted SOC of the selected cell from an initial SOC value or an SOC of the selected cell determined from performing a previous one of the iterations; determine a predicted error covariance of the predicted SOC from an initial error covariance value or an error covariance determined from performing the previous one of the iterations; update the predicted SOC to determine an updated SOC of the selected cell, wherein updating the predicted SOC comprises adding a weighted correction factor that is determined using the predicted error covariance to the predicted SOC; and update the predicted error covariance to determine an updated error covariance. The selected cell may be selected from multiple battery cells, the weighted correction factor may be determined using a difference between a measured cell voltage (SEV) and a predicted SEV of the selected cell, and the method further may further comprise using the controller to determine the selected cell to be the battery cell having the lowest measured SEV.

Determining the selected cell to be the battery cell having the lowest measured SEV may comprise using the controller to obtain, multiple times during an election period, measurements of the SEV of each of the battery cells; and determine the selected cell to be the battery cell found most often to have the lowest measured SEV during the election period.

The controller may repeatedly determine, for each of at least two of the election period, which of the battery cells most often has the lowest measured SEV, and the selected cell may be determined from measurements obtained during the election period that has most recently elapsed.

Each of the iterations may further comprise using the controller to low-pass filter the measured SEV prior to using it to determine the weighted correction factor.

An exponentially-weighted infinite impulse response filter may be used to low-pass filter the measured SEV.

The filter may have a smoothing factor of 0.1.

The method may further comprise using the controller to obtain a measurement of current flowing through the battery cell ("current measurement"), and the weighted correction factor may vary inversely with the magnitude of the current measurement; that is, the weighted correction factor may decrease as the magnitude of the current measurement increases and increase as the magnitude of the current measurement decreases.

The updated error covariance may be used to determine the predicted error covariance of a subsequent one of the iterations, wherein $$\Sigma_{e,k+} = \Sigma_{e,k-} \cdot (1 - K \cdot C),$$
$$K = \Sigma_{e,k-} \cdot C^T \cdot S^{-1},$$
$$C = \frac{\partial}{\partial SOC} OCV(SOC_{k,(-)}) - M(SOC_{k,(-)}), \text{ and}$$
$$S = C \cdot \Sigma_{e,k-} \cdot C^T + v_k(I),$$

wherein $\Sigma_{e,k+}$ is the updated error covariance, $\Sigma_{e,k-}$ is the predicted error covariance, $$\frac{\partial}{\partial SOC} OCV(SOC_{k,(-)})$$

is the partial derivative of the open circuit voltage of the selected cell at the predicted SOC with respect to the SOC of the selected cell, $M(SOC_{k,(-)})$ is hysteresis of the selected cell at the predicted SOC, and $v_k(I)$ is a measurement covariance. The measurement covariance may decrease as the magnitude of the current measurement decreases and increase as the magnitude of the current measurement increases.

The measurement covariance may be of the form $A \cdot I + b$, where A and b are constants and I is the magnitude of the current measurement.

The method may further comprise using the controller to low-pass filter the measurement covariance prior to using it to determine the updated error covariance.

An exponentially-weighted infinite impulse response filter may be used to low-pass filter the measurement covariance.

According to another aspect, there is provided a method for iteratively determining state of charge (SOC) of a battery cell ("selected cell"), the method comprising using a controller to perform a number of iterations, wherein each of the iterations comprises using the controller to determine a predicted SOC of the selected cell from an initial SOC value or an SOC of the selected cell determined from performing a previous one of the iterations; determine a predicted error covariance of the predicted SOC from an initial error covariance value or an error covariance determined from performing the previous one of the iterations; obtain a measurement of current flowing through the selected cell ("current measurement"); update the predicted SOC to determine an updated SOC of the selected cell, wherein updating the predicted SOC comprises adding a weighted correction factor that is determined using the predicted error covariance to the predicted SOC and wherein the weighted correction factor decreases as the magnitude of the current measurement increases and increases as the magnitude of the current measurement decreases; and update the predicted error covariance to determine an updated error covariance.

The selected cell may be selected from multiple battery cells, the weighted correction factor may be determined using a difference between a measured cell voltage (SEV) and a predicted SEV of the selected cell, and the method may further comprise using the controller to determine the selected cell to be the battery cell having the lowest measured SEV.

Determining the selected cell to be the battery cell having the lowest measured SEV may comprise using the controller to obtain, multiple times during an election period, measurements of the SEV of each of the battery cells; and determine the selected cell to be the battery cell found most often to have the lowest measured SEV during the election period.

The controller may repeatedly determine, for each of at least two of the election period, which of the battery cells most often has the lowest measured SEV, and the selected cell may be determined from measurements obtained during the election period that has most recently elapsed.

Each of the iterations may further comprise using the controller to low-pass filter the measured SEV prior to using it to determine the weighted correction factor.

An exponentially-weighted infinite impulse response filter may be used to low-pass filter the measured SEV.

The filter may have a smoothing factor of 0.1.

The updated error covariance may be used to determine the predicted error covariance of a subsequent one of the iterations, wherein $$\Sigma_{e,k+} = \Sigma_{e,k-} \cdot (1 - K \cdot C),$$

$$K = \Sigma_{e,k-} \cdot C^T \cdot S^{-1},$$

$$C = \frac{\partial}{\partial SOC} OCV(SOC_{k,(-)}) - M(SOC_{k,(-)}), \text{ and}$$

$$S = C \cdot \Sigma_{e,k-} \cdot C^T + v_k(I),$$

$\Sigma_{e,k+}$ is the updated error covariance, $\Sigma_{e,k-}$ is the predicted error covariance, $$\frac{\partial}{\partial SOC} OCV(SOC_{k,(-)})$$

is the partial derivative of the open circuit voltage of the selected cell at the predicted SOC with respect to the SOC of the selected cell, $M(SOC_{k,(-)})$ is hysteresis of the selected cell at the predicted SOC, and $v_k(I)$ is a measurement covariance. The measurement covariance may decrease as the magnitude of the current measurement decreases and increase as the magnitude of the current measurement increases.

The measurement covariance may be of the form A·I+b, where A and b are constants and I is the magnitude of the current measurement.

The method may further comprise using the controller to low-pass filter the measurement covariance prior to using it to determine the updated error covariance.

An exponentially-weighted infinite impulse response filter may be used to low-pass filter the measurement covariance.

According to another aspect, there is provided a method for iteratively determining state of charge (SOC) of a battery cell ("selected cell"), the method comprising using a controller to perform a number of iterations, wherein each of the iterations comprises using the controller to determine a predicted SOC of the selected cell from an initial SOC value or an SOC of the selected cell determined from performing a previous one of the iterations; determine a predicted error covariance of the predicted SOC from an initial error covariance value or an error covariance determined from performing the previous one of the iterations; update the predicted SOC to determine an updated SOC of the selected cell, wherein updating the predicted SOC comprises adding a weighted correction factor that is determined using the predicted error covariance to the predicted SOC; and update the predicted error covariance to determine an updated error covariance. The selected cell may be selected from multiple battery cells and the weighted correction factor may be determined using a difference between a measured cell voltage (SEV) and a predicted SEV of the selected cell, and each of the iterations may further comprise using the controller to low-pass filter the measured SEV prior to using it to determine the weighted correction factor.

The method may further comprise using the controller to determine the selected cell to be the battery cell having the lowest measured SEV.

Determining the selected cell to be the battery cell having the lowest measured SEV may comprise using the controller to obtain, multiple times during an election period, measurements of the SEV of each of the battery cells; and determine the selected cell to be the battery cell found most often to have the lowest measured SEV during the election period.

The controller may repeatedly determine, for each of at least two of the election period, which of the battery cells most often has the lowest measured SEV, and the selected cell may be determined from measurements obtained during the election period that has most recently elapsed.

An exponentially-weighted infinite impulse response filter may be used to low-pass filter the measured SEV.

The filter may have a smoothing factor of 0.1.

The method may further comprise using the controller to obtain a measurement of current flowing through the battery cell ("current measurement"), and the weighted correction factor may decrease as the magnitude of the current measurement increases and increase as the magnitude of the current measurement decreases.

The updated error covariance may be used to determine the predicted error covariance of a subsequent one of the iterations, wherein $$\Sigma_{e,k+} = \Sigma_{e,k-} \cdot (1 - K \cdot C),$$

$$K = \Sigma_{e,k-} \cdot C^T \cdot S^{-1},$$

$$C = \frac{\partial}{\partial SOC} OCV(SOC_{k,(-)}) - M(SOC_{k,(-)}), \text{ and}$$

$$S = C \cdot \Sigma_{e,k-} \cdot C^T + v_k(I),$$

wherein $\Sigma_{e,k+}$ is the updated error covariance, $\Sigma_{e,k-}$ is the predicted error covariance, $$\frac{\partial}{\partial SOC} OCV(SOC_{k,(-)})$$

is the partial derivative of the open circuit voltage of the selected cell at the predicted SOC with respect to the SOC of the selected cell, $M(SOC_{k,(-)})$ is hysteresis of the selected cell at the predicted SOC, and $v_k(I)$ is a measurement covariance. The measurement covariance may decrease as the magnitude of the current measurement decreases and increase as the magnitude of the current measurement increases.

The measurement covariance may be of the form A·I+b, where A and b are constants and I is the magnitude of the current measurement.

The method may further comprise using the controller to low-pass filter the measurement covariance prior to using it to determine the updated error covariance.

An exponentially-weighted infinite impulse response filter may be used to low-pass filter the measurement covariance.

According to another aspect, there is provided a system for iteratively determining SOC of the selected cell. The selected cell may comprise one of multiple battery cells, and the system may comprising voltmeters for measuring a voltage across each of the battery cells; an ammeter for measuring a current flowing through the selected cell; and a controller communicatively coupled to the voltmeters and the ammeter. The controller may be configured to perform any of the foregoing aspects of the method or suitable combinations thereof.

According to another aspect, there is provided a non-transitory computer readable medium having encoded thereon computer program code that, when executed, causes a processor to perform any of the foregoing aspects of the method or suitable combinations thereof.

This summary does not necessarily describe the entire scope of all aspects. Other aspects, features and advantages will be apparent to those of ordinary skill in the art upon review of the following description of specific embodiments.

BRIEF DESCRIPTION OF THE DRAWINGS

In the accompanying drawings, which illustrate one or more example embodiments.

DETAILED DESCRIPTION

Figure 1:
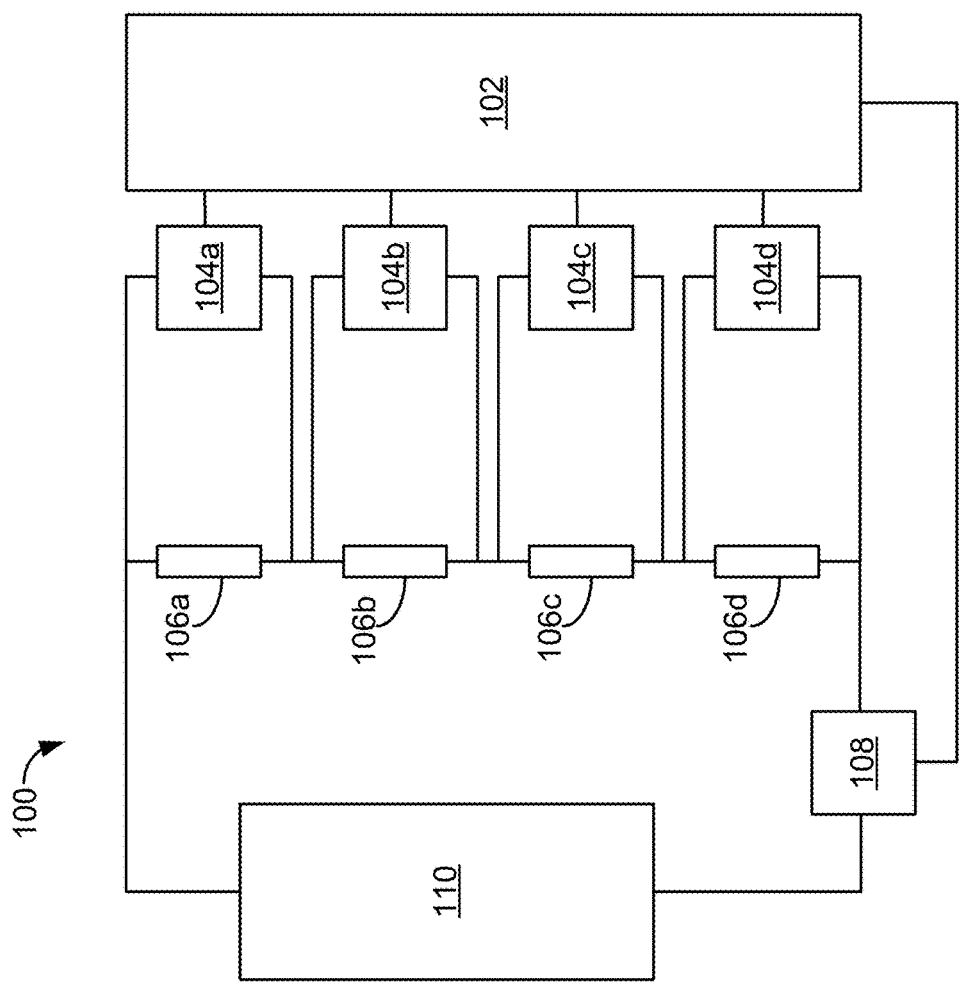
FIG. 1 is a system for iteratively determining state of charge of a battery cell, according to one example embodiment.

Directional terms such as "top", "bottom", "upwards", "downwards", "vertically", and "laterally" are used in the following description for the purpose of providing relative reference only, and are not intended to suggest any limitations on how any article is to be positioned during use, or to be mounted in an assembly or relative to an environment. Additionally, the term "couple" and variants of it such as "coupled", "couples", and "coupling" as used in this description are intended to include indirect and direct connections unless otherwise indicated. For example, if a first device is coupled to a second device, that coupling may be through a direct connection or through an indirect connection via other devices and connections. Similarly, if the first device is communicatively coupled to the second device, communication may be through a direct connection or through an indirect connection via other devices and connections. Furthermore, the singular forms "a", "an", and "the" as used in this description are intended to include the plural forms as well, unless the context clearly indicates otherwise.

A lithium ion battery (hereinafter interchangeably referred to as a "battery pack") comprises one or more lithium ion cells; when the battery comprises multiple cells, they are electrically coupled together in one or both of parallel and series. Additionally, a lithium ion battery may comprise any one of a variety of different battery chemistries; example chemistries are lithium manganese oxide (LMO), lithium iron phosphate (LFP), lithium nickel manganese cobalt oxide (NMC), lithium nickel cobalt aluminum oxide (NCA), lithium titanate (LTO), and lithium cobalt oxide (LCO).

One problem encountered when using a lithium ion battery is determining the state of charge (SOC) of the battery at any given time, where SOC is expressed as a percentage of total charge. Typically, determining the SOC of a battery comprises obtaining the open circuit voltage (OCV) of the battery. However, obtaining the OCV of the battery is impeded by the battery's internal resistance and by the fact that battery manufacturers typically recommend that OCV be measured after the battery has been allowed to rest (i.e., after the battery has had no current flowing through it) for a certain relaxation period. It is not uncommon for this relaxation period to be approximately twenty minutes or longer. Clearly, abiding by this manufacturer recommendation is problematic when trying to obtain real-time SOC measurements while current is being drawn from the battery.

The embodiments described herein are directed at methods, systems, and techniques for iteratively determining SOC of a battery cell, with the SOC of one of the cells comprising the battery being used as a proxy for the entire battery's SOC. In certain example embodiments, iteration is performed using a Kalman filter and the SOC of one of the battery's cells is used as the state of the Kalman filter and the voltage of that cell (SEV) is used as the input and output of the Kalman filter; various example methods for determining which of the battery's cells to select are described below. In certain embodiments, the SEV is low-pass filtered, and more particularly filtered using an infinite impulse response (IIR) filter, prior to being input to the Kalman filter. Additionally, in certain embodiments the Kalman filter's measurement covariance is weighted so that the confidence placed in SEV measurements is inversely proportional to the magnitude of the current flowing through the battery ("pack current"); that is, the confidence placed in SEV measurements increases as the magnitude of the pack current decreases, and vice-versa. This models the uncertainty amplified at relatively high currents resulting, for example, from inaccurate battery charge and discharge internal resistances and noise.

Referring now to FIG. 1, there is shown a system 100 for iteratively determining state of charge of a battery, according to one example embodiment in which iteration is performed using a Kalman filter. The system 100 comprises first through fourth battery cells 106a-d (collectively, "cells 106"), first through fourth voltmeters 104a-d (collectively, "voltmeters 104"), an electrical load 110, an ammeter 108, and a controller 102. In one embodiment, SLPB 100216216H NMC cells from Kokam™ Co., Ltd. may be used as the cells 106. The cells 106 are electrically coupled together in series, and electrically coupled in parallel across each of the first through fourth cells 106a-d are the first through fourth voltmeters 104a-d, respectively. The load 110 is electrically coupled across the cells 106, and electrically coupled in series between the load 110 and the cells 106 is the ammeter 108. Each of the first through fourth voltmeters 104a-d and the ammeter 108 is communicatively coupled to the controller 102; the controller 102 can accordingly measure the SEV across any one or more of the cells 106 and the current being drawn from the cells 106 by the load 110.

In the depicted embodiment, the controller 102 comprises a processing unit (such as a processor, microprocessor, or programmable logic controller) communicatively coupled to a non-transitory computer readable medium having stored on it program code for execution by the processing unit. Example program code may comprise code causing the processing unit to perform any one or more of the methods shown in FIGS. 2 and 3 and described below.

Figure 2:
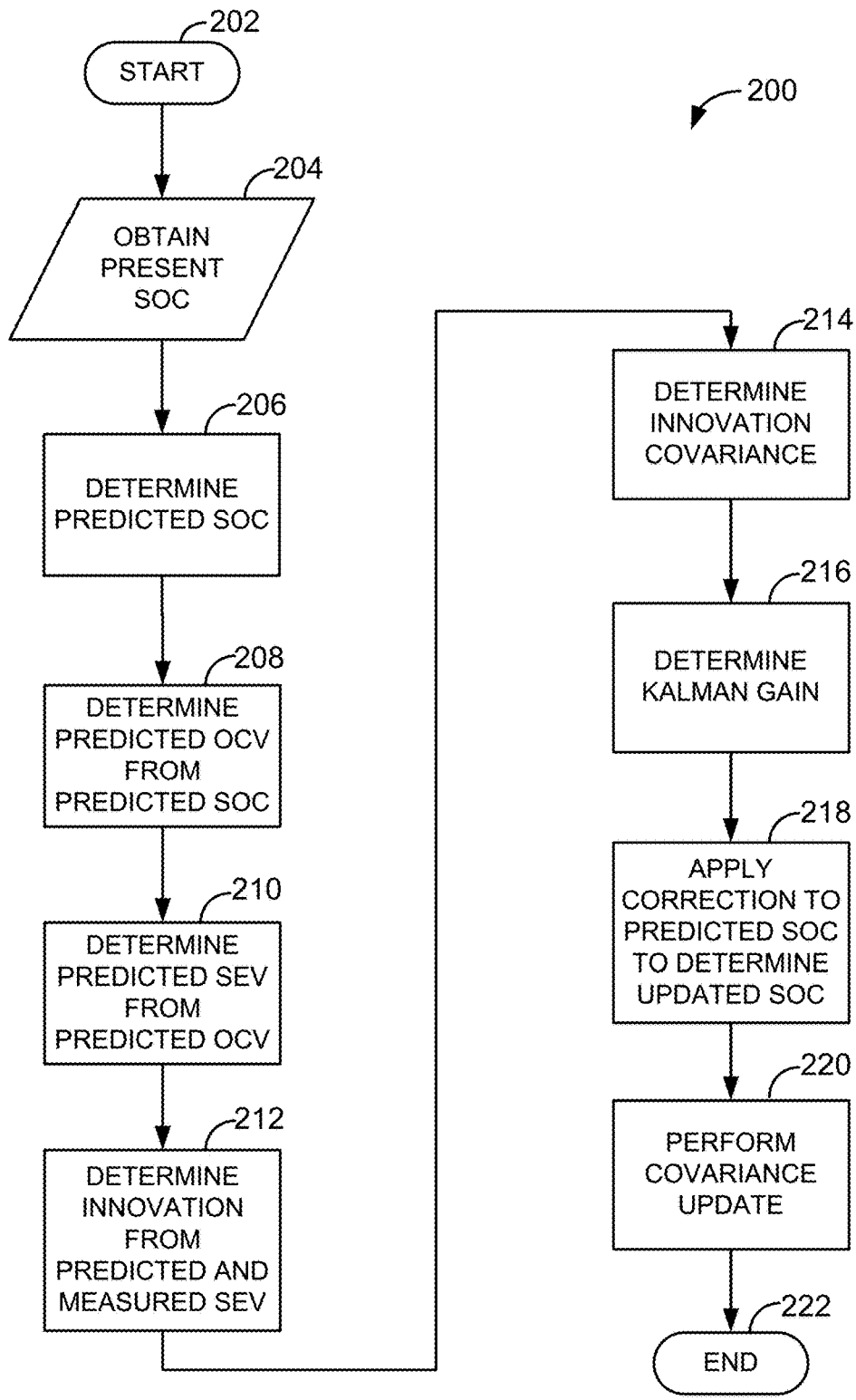
FIGS. 2 and 3 are methods for iteratively determining state of charge of a battery cell, according to additional example embodiments.

Referring now to FIG. 2, there is shown a method 200 for iteratively determining SOC of any one of the cells 106 ("selected cell 106"), according to an example embodiment in which iteration is performed using a Kalman filter. In this example embodiment, the controller 102 is configured to perform the method 200 iteratively at a rate of once per second, with the first iteration of the method 200 relying on reasonable initial values pre-programmed into the controller 102 and with each subsequent iteration of the method 200 relying on values determined during the immediately preceding iteration.

Generally, for any second and subsequent iteration of the method 200, the controller 102 determines a predicted SOC of the selected cell 106 from an SOC of the selected cell determined during a previous one of the iterations, and in this example embodiment the immediately previous one of the iterations. The controller 102 similarly determines a predicted error covariance of the predicted SOC from an error covariance determined from performing a previous one of the iterations, and in this example embodiment the immediately previous one of the iterations. The controller 102 then updates the predicted SOC and predicted error covariance. The controller 102 updates the predicted SOC to determine an updated SOC by adding a weighted correction factor determined using the predicted error covariance to the predicted SOC, and updates the predicted error covariance to determine an updated error covariance for use in a subsequent iteration of the method 200, and in this example embodiment the immediately subsequent iteration.

For any given iteration k of the method 200, the controller 102 begins performing the method 200 at block 202 and proceeds to block 204 where it obtains the present SOC ($SOC_{k-1,(+)}$) for the selected cell 106. If the controller 102 is performing the method 200 for the first time, the controller 102 retrieves from a memory (not shown) or requests from a user a reasonable initial value for $SOC_{k-1,(+)}$, such as 50%; this initial value is the "initial SOC value". If the controller 102 has in the immediately previous iteration (iteration k−1) of the method 200 determined and stored a value for the selected cell's 106 SOC, then the controller 102 uses that stored SOC value as $SOC_{k-1,(+)}$.

The controller 102 then proceeds to block 206 where it determines a predicted SOC ($SOC_{k,(-)}$) from the current SOC. In the depicted embodiment, the controller 102 does this by performing coulomb counting in accordance with Equation (1):

$$(SOC_{k,(-)}) = SOC_{k-1,(+)} + \frac{\mu_{1,2} \cdot \Delta t \cdot I}{C_n} \qquad (1)$$

where $C_n$ is the capacity of the selected cell 106, $\mu_1$ is the charge efficiency of the selected cell 106 and is used if coulomb counting is performed while the selected cell 106 is being charged, $\mu_2$ is the discharge efficiency of the selected cell 106 and is used if coulomb counting is performed while the selected cell 106 is being discharged, $\Delta t$ is the duration for which coulomb counting is performed, and I is the current flowing through the selected cell 106 while coulomb counting is performed.

Once the controller 102 determines the predicted SOC, it determines a predicted OCV ($OCV(SOC_{k,(-)})$) from the predicted SOC. The controller 102 does this by looking up, in a lookup table in memory that relates SOC and OCV values for the selected cell 106, the SOC that corresponds to the predicted OCV. The lookup table is typically provided by the selected cell's 106 manufacturer. An example lookup table is provided below as Table 1:

TABLE 1

Example of Table Relating SOC and OCV for the Selected Cell 106

| SOC (%) | OCV (V) |
|---|---|
| 100% | 4.18 |
| 95% | 4.126955 |
| 90% | 4.063716 |
| 85% | 4.006667 |
| 80% | 3.953868 |
| 75% | 3.903386 |
| 70% | 3.851101 |
| 65% | 3.795224 |
| 60% | 3.750318 |
| 55% | 3.717109 |
| 50% | 3.69098 |
| 45% | 3.669695 |
| 40% | 3.651556 |
| 35% | 3.63376 |
| 30% | 3.612777 |
| 25% | 3.58782 |
| 20% | 3.561656 |
| 15% | 3.53212 |
| 10% | 3.496494 |
| 5% | 3.456959 |

After determining the predicted OCV, the controller 102 proceeds to block 210 and determines a predicted SEV ($SEV_k$) for the selected cell 106 from the predicted OCV. The controller 102 does this by taking into account the selected cell's 106 internal resistance and voltage offset resulting from charge/discharge hysteresis effects in accordance with Equation (2):

$$SEV = OCV(SOC_{k,(-)}) + 1 \cdot R_k + M(SOC_{k,(-)}) \qquad (2)$$

where $R_k$ is the internal resistance of the selected cell 106, which may differ depending on whether the selected cell 106 is being charged or discharged, and $M(SOC_{k,(-)})$ represents the SEV offset resulting from any charge/discharge hysteresis inherent in the selected cell 106.

After determining the predicted SEV, the controller 102 proceeds to block 212 and determines the "innovation" (y~) by comparing measured SEV with the predicted SEV, as follows:

$$y^\sim = SEV_k - SOC_{k,(-)} \cdot C \quad (3)$$

In Equation (3), C is the observation matrix, defined as follows:

$$C = \frac{\partial}{\partial SOC} OCV(SOC_{k,(-)}) - M(SOC_{k,(-)}) \quad (4)$$

where $$\frac{\partial}{\partial SOC} OCV(SOC_{k,(-)})$$

is the partial derivative of the SOC vs. OCV plot at $SOC_{k,(-)}$, typically provided by the selected cell's 106 manufacturer, with respect to SOC of the selected cell 106.

After determining the innovation, the controller 102 proceeds to block 214 where it determines the innovation covariance (S) as follows:

$$S = C \cdot \Sigma_{e,k-} \cdot C^T + v_k(I) \quad (5)$$

In Equation (5), $v_k(I)$ is the measurement covariance and $\Sigma_{e,k-}$ is the error covariance, defined as follows:

$$\Sigma_{e,k-} = A \cdot \Sigma_{e,k-} \cdot A^T + w_k \quad (6)$$

where $w_k$ is the process covariance and A=1.

If the controller 102 is performing the method 200 for the first time, the controller 102 retrieves from a memory (not shown) a reasonable value for $\Sigma_{e,k-1}$, such as 100; this initial value is the "initial error covariance value". If the controller 102 has in the immediately previous iteration (iteration k−1) of the method 200 determined and stored a value for the $\Sigma_{e,k-1}$, then the controller 102 uses that stored value as $\Sigma_{e,k-1}$.

The controller 102 then proceeds to block 216 where it determines the Kalman Gain (K), as follows:

$$K = \Sigma_{e,k-} C^T \cdot S^{-1} \quad (7)$$

After determining the Kalman Gain, the controller 102 proceeds to block 218 to apply a correction to the predicted SOC to determine an updated SOC ($SOC_{k,(+)}$), as follows:

$$SOC_{k,(+)} = SOC_{k,(-)} + K \cdot y^\sim \quad (8)$$

As discussed above in respect of block 204, $SOC_{k,(+)}$ serves as the present SOC for the immediately subsequent iteration (iteration k+1) of the method 200. K·y~ is the weighted correction factor in this example embodiment.

The controller 102 also performs a covariance update at block 220 to update the predicted error covariance, i.e. to determine $\Sigma_{e,k+}$, which as mentioned above in respect of block 214 serves as $\Sigma_{e,k-1}$ for the immediately subsequent iteration (iteration k+1) of the method 200. The controller 102 determines $\Sigma_{e,k+}$ using Equation (9):

$$\Sigma_{e,k+} = \Sigma_{e,k-} \cdot (1 - K \cdot C) \quad (9)$$

After block 220, the controller 102 proceeds to block 222 where the method 200 ends. For subsequent iterations of the method 200, k is incremented by 1 and the controller 102 then returns to block 202 and begins performing the method 200 again.

In one example embodiment, $R_k$ when the selected cell 106 is discharging is 700μΩ, $R_k$ when the selected cell 106 is charging is 500μΩ, no hysteresis is presumed so $M(SOC_{k,(-)})=0$, $u_1=95\%$, $u_2=100\%$, $w_k=100$, $v_k(I)=(10/3)*$ (pack current magnitude), and $C_n=75$ Ah. Particular values for $v_k(I)$ in various embodiments are discussed in more detail below.

While in this example embodiment one constant $R_k$ value is provided for use during charging and another constant $R_k$ value is provided for use during discharging, in alternative embodiments (not depicted) $R_k$ may be non-constant and may be a function of at least one of SOC, temperature, cell age, and pack current magnitude. Additionally or alternatively, the other variables used in Equations (1)-(9) (e.g., $u_{1,2}$, $w_k$) may also vary with at least one of SOC, temperature, cell age, and pack current magnitude notwithstanding that in the above example embodiment they may be constant. Hysteresis, for example, may in alternative embodiments be non-zero and may vary with temperature, cell age, and pack current magnitude in addition or as an alternative to $SOC_{k,(-)}$ as shown above. As another example, while $v_k$ varies with pack current magnitude above, in alternative embodiments is may additionally or alternatively vary with at least one of variables such as SOC, temperature, and cell age.

Additionally, in this example embodiment multiple cells 106 that are electrically coupled in parallel are modeled as a single cell 106 and consequently pack current magnitude and I are identical. In alternative embodiments (not depicted), cells 106 connected in parallel may not be modeled as a single cell 106; instead, current may be measured through each of the cells 106 in parallel, which would result in the pack current magnitude and I differing. For example, for a battery pack consisting of two 75 Ah cells 106 connected in parallel, in the depicted embodiment these two cells 106 are modeled as a single cell 106 having a capacity of 150 Ah with pack current magnitude=I; in an alternative embodiment in which the battery pack's cells 106 are individually monitored, pack current magnitude=2·I.

FIG. 2 describes operation of an extended Kalman filter; in alternative embodiments (not depicted) different types of Kalman filters may be used depending, for example, on the desired accuracy. For example, in some example embodiments, a linear Kalman filter may be used. Additionally, variants of the extended Kalman filter may be used; examples of these variants include unscented Kalman filters, robust extended Kalman filters, invariant extended Kalman filters, and extended Kalman filters of first and higher orders. The Kalman filter may be implemented in continuous-time (e.g., the Kalman-Bucy filter), discrete-time, or as a continuous-time and discrete-time hybrid.

Figure 3:
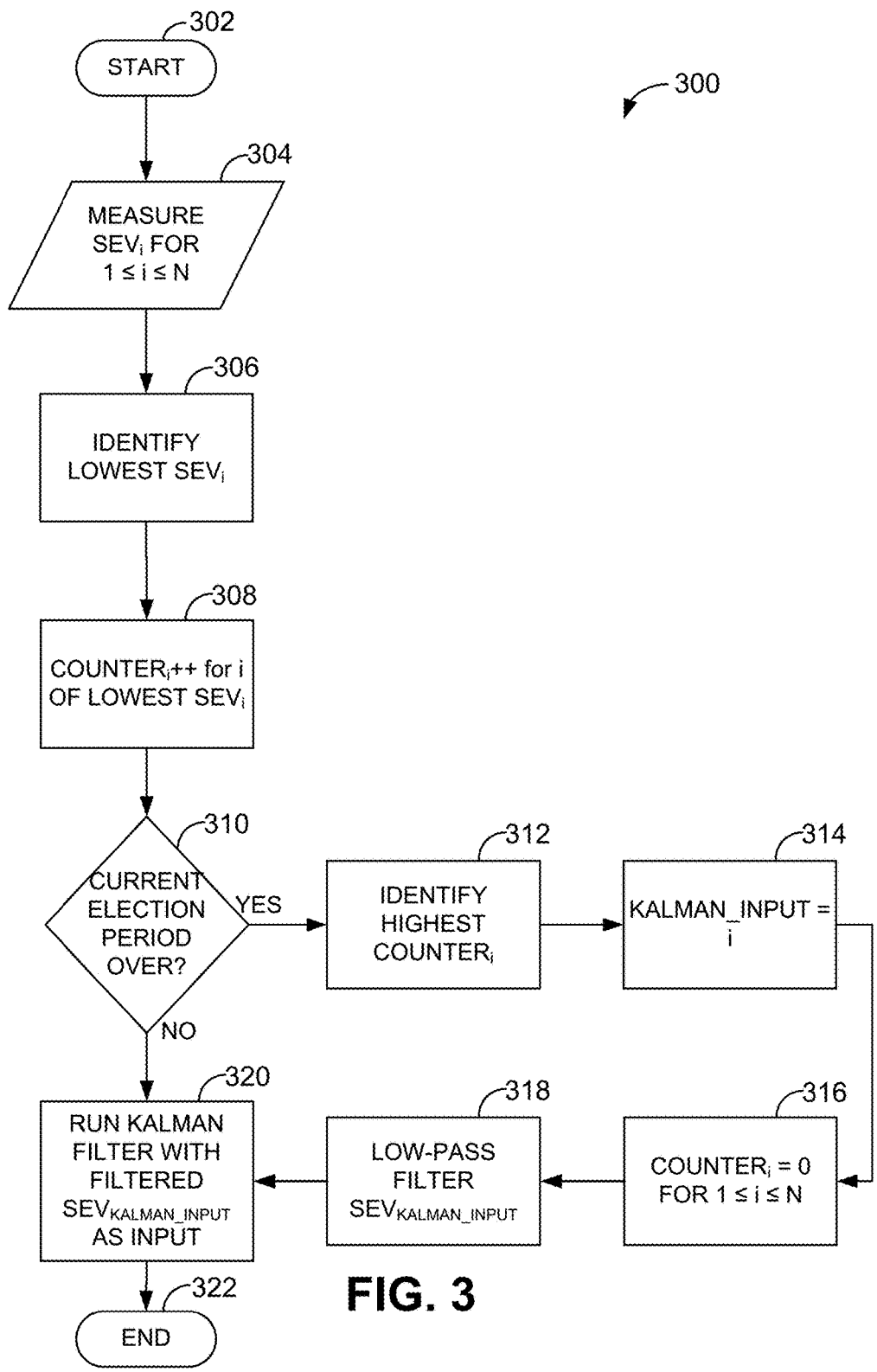

Referring now to FIG. 3, there is shown a method 300 for iteratively determining SOC of the selected cell 106, according to another example embodiment in which iteration is performed using a Kalman filter. In this example embodiment, the controller 102 is configured to perform the method 300 at a rate of once per second. FIG. 3 references several variables, which the controller 102 initializes or is configured with prior to performing the first iteration of the method 300. These variables include N, $SEV_i$, $COUNTER_i$, and KALMAN_INPUT. N is the total number of the cells 106 in the battery pack that the controller 102 is monitoring; $SEV_i$ is the cell voltage for the $i^{th}$ cell of the battery pack being monitored, where 1≤i≤N; $COUNTER_i$ is a counter associated with each of the cells 106 used to monitor which of the cells 106 has the lowest SEV over a period of time referred to as an "election period"; and KALMAN_INPUT is i of the selected cell 106, which in the embodiment of FIG. 3 is the cell 106 that is determined to have the lowest SEV during the election period. In one example embodiment, the election period is one minute, and consequently the controller 102 performs the method 300 sixty times per election period. Prior to performing the method 300, N is set to equal the total number of the cells 106 of the battery pack, $SEV_i$ and $COUNTER_i$ are each initialized to zero for all i, and i and KALMAN_INPUT are each initialized to one.

The controller 102 begins at block 302 when performing the method 300 and proceeds to block 304 where it measures $SEV_i$ for all i. Using the system 100 of FIG. 1 as an example, the controller 102 measures $SEV_1$, $SEV_2$, $SEV_3$, and $SEV_4$, corresponding to the first through fourth cells 106a-d, respectively, using the first through fourth voltmeters 104a-d, respectively. The controller 102 conditions these signals by, for example, performing at least one of hardware (e.g. analog) and software filtering on them. The controller 102 then proceeds to block 306 where it identifies the lowest $SEV_i$ measured at block 304. The controller 102 proceeds to block 308 where it increments $COUNTER_i$ by one for i that corresponds to the lowest $SEV_i$ measured at block 304. The controller 102 then proceeds to block 310 where it determines whether the current election period is over. In the example embodiment in which the election period is one minute and the controller 102 performs the method 300 every second, the election period is over once it has been performed sixty times. If the election period has not ended yet, the controller 102 proceeds to block 320 where it runs the Kalman filter in accordance with the method 200 of FIG. 2 using $SEV_{KALMAN\_INPUT}$ determined during the last election period from a previous iteration of the method 300 or, if the method 300 is being run before the end of the first election period, using $SEV_i$. If the election period has ended, the controller 102 proceeds to block 312 where it identifies the highest $COUNTER_i$ for all i; the $i^{th}$ cell for which $COUNTER_i$ is highest is said to have "won the election" and is deemed to be the selected cell 106. The selected cell 106 is accordingly the cell 106 that, during the election period, consistently is measured to have the lowest SEV; this cell 106 typically governs SOC of the battery pack and is accordingly the subject of the Kalman filter.

After identifying the highest $COUNTER_i$ the controller 102 assigns KALMAN_INPUT to be i (block 314), resets $COUNTER_i$ to zero for all i in anticipation of the next election period (block 316), filters $SEV_{KALMAN\_INPUT}$ using a low-pass filter as discussed in more detail below (block 318), and then runs the Kalman filter according to the method 200 of FIG. 2 using $SEV_{KALMAN\_INPUT}$ as the filter's input (block 320). After running the Kalman filter at block 320 the controller 102 proceeds to block 322 where the method 300 ends. In the depicted example embodiment the controller 102 performs the method 300 once a second and the election period is one minute; accordingly, the selected cell 106 is updated every minute, and the SEV for that selected cell 106 is used as the input to the Kalman filter for at least the next election period while the controller 102 is determining the winner of the next election.

In the above embodiment, prior to the first iteration of the method 300 KALMAN_INPUT is initialized to one and, consequently, $SEV_1$ is arbitrarily used as the input to the Kalman filter until the first election period ends. In alternative embodiments, however, a different voltage may be input to the Kalman filter; for example, KALMAN_INPUT may be set to the i of the lowest $SEV_i$ from the first iteration of the method 300. Alternatively, the Kalman filter may not be run until the first election period has ended and a value for KALMAN_FILTER has been set at block 314. For example, an additional decision block (not depicted) may be present between blocks 310 and 320 in FIG. 3. If the election period 310 is not over and the controller 102 proceeds from block 310 to this decision block, the controller 102 then determines whether KALMAN_INPUT has been set by virtue of the result of a previous election period. If yes, the controller 102 then proceeds to block 320 from this additional block and runs the Kalman filter using $SEV_{KALMAN\_INPUT}$; i.e., the controller 102 runs the Kalman filter based on the winner of the last election. If no, the controller 102 bypasses block 320 and proceeds from block 310 directly to block 322, where the method 300 ends; i.e., the controller 102 will wait until the winner of the first election is determined before running the Kalman filter at all.

At block 318 the controller 102 applies a low-pass filter to $SEV_{KALMAN\_INPUT}$; this may be done in a variety of ways. An analog filter such as an RC filter may be used, for example, to filter $SEV_{KALMAN\_INPUT}$. Alternatively, a digital filter may be used; for example, infinite impulse response (IIR) and finite impulse response (FIR) filters may be used. In one example embodiment, the controller 102 applies an exponentially-weighted moving average IIR filter to $SEV_{KALMAN\_INPUT}$ at block 318 in accordance with Equations (10) and (11):

$$y_j = \alpha x_j + (1-\alpha) \cdot y_{j-1} \quad (10)$$

where $y_j$ is the filtered $SEV_{KALMAN\_INPUT}$ for iteration j of the method 300, $y_{j-1}$ is the filtered $SEV_{KALMAN\_INPUT}$ for iteration j-1 of the method 300, $x_j$ is the unfiltered $SEV_{KALMAN\_INPUT}$ for iteration j of the method 300, and $\alpha$ (the "smoothing factor") is defined as follows:

$$\alpha \triangleq \frac{\Delta_T}{RC + \Delta_T} \quad (11)$$

In Equation (11), $\Delta_T$ is the time between iterations of the method 300, or in the embodiment described above 1 second. RC is the time constant, which in the example embodiment above is set to 9 seconds; accordingly, the smoothing factor in the example embodiment above is 0.1. In alternative embodiments, the values for any one or more of the smoothing factor, the time constant, and $\Delta_T$ may be different.

Additionally or alternatively, in some example embodiments the measurement covariance ($v_k(I)$) of the Kalman filter may vary as the controller 102 operates the filter so that confidence in the SOC readings varies inversely with the pack current magnitude; that is, the confidence in the SOC readings decreases as the pack current magnitude increases and increases as the pack current magnitude decreases. In conventional Kalman filter operation, the measurement covariance is a constant and is fitted from experimental data. In some of the embodiments described herein, the measurement covariance increases and decreases as pack current magnitude increases and decreases, respectively, to model the inaccuracies introduced to SOC readings (e.g. as a result of the cells' 106 internal resistances) that vary with pack current magnitude. In the depicted example embodiment, a battery pack is modeled as comprising cells 106 electrically coupled only in series; consequently, the pack current flows through each of the cells 106. In an alternative embodiment (not depicted), if a battery pack comprises cells 106 connected in parallel, instead of using the pack current magnitude to model the behavior of a particular one of the cells 106, only the current flowing through that cell 106 may be used.

In one of these example embodiments, the measurement covariance is set to A·I+b, where I is the pack current magnitude, A is a scalar for the pack current magnitude, and b is a constant. As described above, in one example embodiment A is set to (10/3) and b is set to 0; however, in alternative embodiments one or both of A and b may have different values depending on the type of cells 106 being used and on the electrical configuration of the cells 106 within the battery pack, for example. In another embodiment, for example, A is set to (10/3) and b is set to 1. Furthermore, in additional alternative embodiments, the measurement covariance may take a form other than A·I+b; for example, the measurement covariance may include higher order degrees of I and take the form of $B·I^2+A·I+b$, $C·I^3+B·I^2+A·I+b$, etc.

In additional alternative embodiments in which the measurement covariance varies, the measurement covariance may be filtered prior to use. For example, a low-pass filter may be applied to the measurement covariance. More particularly, an analog filter such as an RC filter may be used or a digital filter may be used (e.g., IIR and FIR filters). In one example embodiment, the controller 102 applies an exponentially-weighted moving average IIR filter to the measurement covariance in accordance with Equations (10) and (11). In an embodiment in which the exponentially-weighted moving average IIR filter as embodied by Equations (10) and (11) is used, RC may be set to 100 seconds, $\Delta_T$ is the time between iterations of the method 300, or in the embodiment described above 1, $y_j$ is the filtered measurement covariance for iteration j of the method 300, $y_{j-1}$ is the filtered measurement covariance for iteration j−1 of the method 300, and $x_j$ is the unfiltered measurement covariance for iteration j of the method 300.

Figure 4:
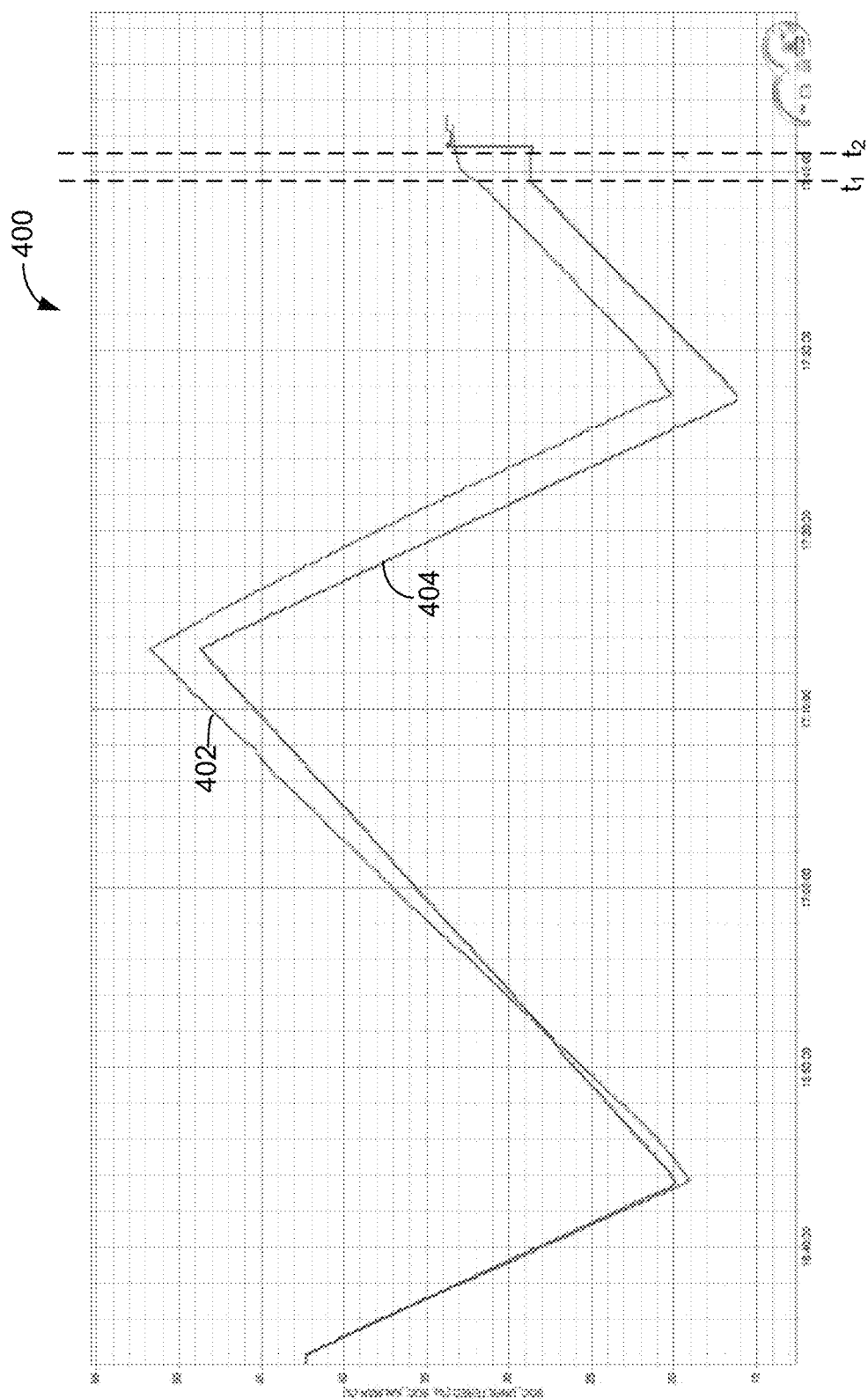
FIGS. 4 and 5 are graphs comparing state of charge determined using conventional coulomb counting vs. using the method of FIG. 3
Figure 5:
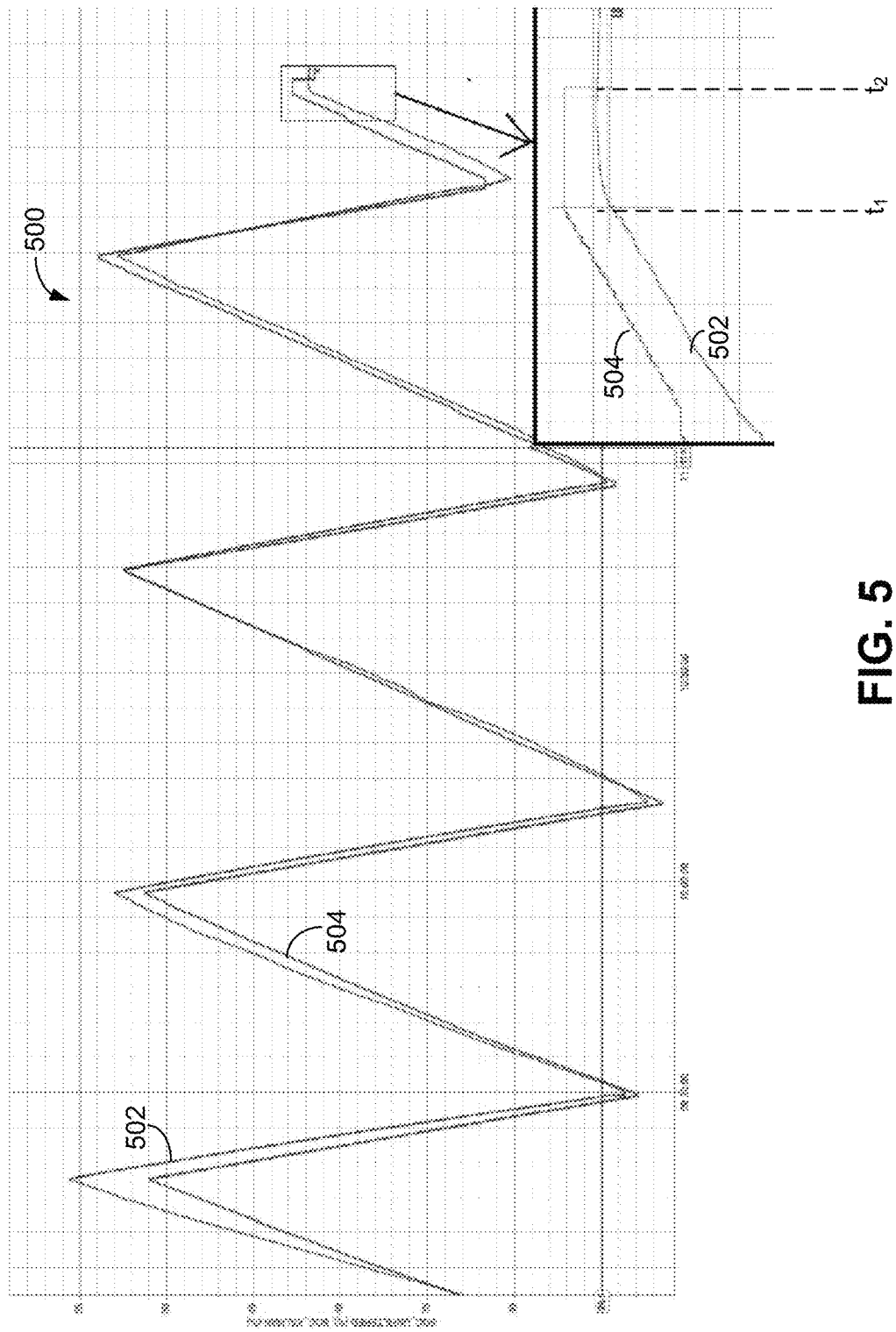
Figure 6:
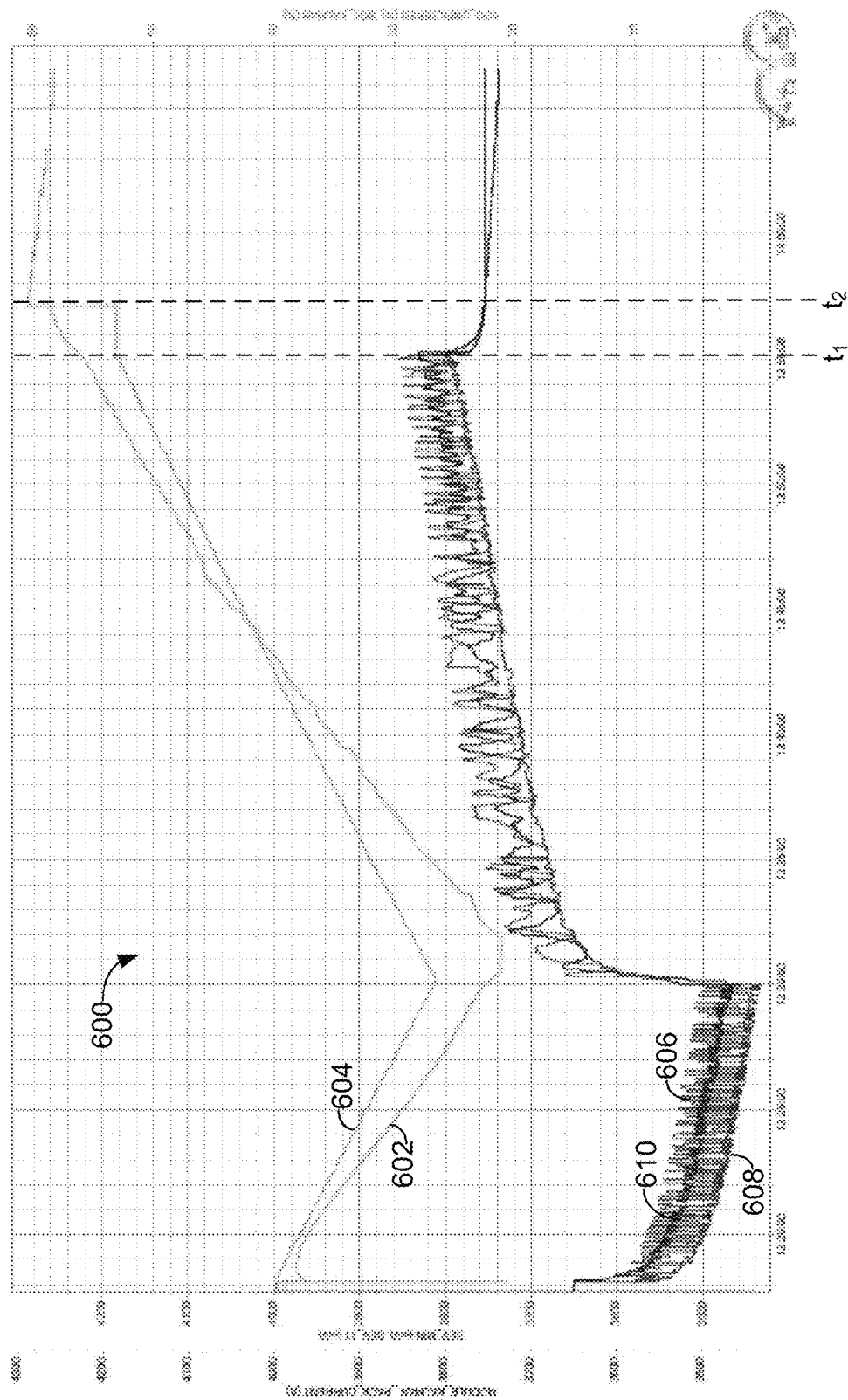
FIG. 6 is a graph comparing state of charge determined using conventional coulomb counting vs. using the method of FIG. 3 and comparing filtered vs. unfiltered input voltages used to perform the method of FIG. 3, according to an additional example embodiment.

Referring now to FIGS. 4 to 6, there are shown graphs 400,500,600 comparing SOC determined using conventional coulomb counting vs. using the method 300 of FIG. 3, with the measurement covariance equaling (10/3)*(pack current magnitude) and with both the measurement covariance and $SEV_i$ filtered using an IIR filter prior to being used in the Kalman filter. In FIG. 4, the battery pack comprises a 12s2p configuration of cells 106 for a total of twenty-four cells 106, and undergoes two partial charge and discharge cycles. Charging is done at 100 A and discharging is done at 200 A, and values of $R_k$, $M(SOC_{k,(-)})$, $u_{1,2}$, $w_k$, $v_k(I)$, and $C_n$ are as described above in respect of FIG. 2. FIG. 4 includes a graph 400 comprising a Kalman curve 402 generated using the method 300 of FIG. 3 and a coulomb counting curve 404 generated using conventional coulomb counting. As the graph 400 shows, while the Kalman and coulomb counting curves 402,404 are similar for the first discharge and part of the first charge cycle, they subsequently diverge with the Kalman curve 402 determining a higher SOC than the coulomb counting curve 404. This is in part because coulomb counting is performed using an open loop system and error when determining SOC using coulomb counting is accordingly cumulative. At time $t_1$ the battery pack is open circuited and after a relaxation period of two minutes the OCV of the battery pack is taken at time $t_2$. The OCV measured at time $t_2$ shows that the SOC as determined using the method 300 of FIG. 3 is within 1% of the open circuit determined using the OCV, while the SOC determined using coulomb counting underestimates the SOC by approximately 5%.

The graph 500 of FIG. 5 is similar to the graph 400 of FIG. 4 except it is over four charge/discharge cycles, with a Kalman curve 502 generated using the method 300 of FIG. 3 and a coulomb counting curve 504 generated using conventional coulomb counting. Charging is done at 100 A and discharging is done at 200 A, and values of $R_k$, $M(SOC_{k,(-)})$, $u_{1,2}$, $w_k$, $v_k(I)$, and $C_n$ are as described above in respect of FIG. 2. As in FIG. 4, the Kalman curve 502 generally determines a higher SOC for the battery pack than the coulomb counting curve 504, although this changes as the battery pack experiences more charge/discharge cycles. When charging and discharging is stopped at time $t_1$, the coulomb counting curve 504 shows a higher SOC than the Kalman curve 502. As in FIG. 4, the battery pack is then open circuited and after a short relaxation period the SOC is determined from an OCV reading at time $t_2$. The SOC shown by Kalman curve 502 is within 0.3% of the SOC determined using an OCV reading, while the SOC shown by the coulomb counting curve is approximately 1% higher than the SOC determined using the OCV reading.

The graph 600 of FIG. 6 also includes a Kalman curve 602 and a coulomb counting curve 604 analogous to the Kalman curves 402,502 and coulomb counting curves 504,604 of FIGS. 4 and 5, respectively. Charging and discharging are done at 100 A and values of $R_k$, $M(SOC_{k,(-)})$, $u_{1,2}$, $w_k$, $v_k(I)$, and $C_n$ are as described above in respect of FIG. 2. The battery pack begins at approximately 60% SOC, it is then discharged to approximately 20% SOC, and then charged back up to approximately 60% SOC. As in FIGS. 4 and 5, charging and discharging are done until time $t_1$ at which point the battery pack is open circuited, the battery pack relaxes for a short period, and the OCV of the battery pack is taken and the SOC is determined using this OCV. As in FIGS. 4 and 5, the Kalman curve 602 is significantly nearer to the SOC determined using the OCV at time $t_2$ than the coulomb counting curve 604.

The graph 600 of FIG. 6 also comprises three additional curves: a weakest cell SEV curve 606, which is the measured SEV of the weakest cell 106 in the battery pack; a lowest SEV curve 608, which is the lowest, unfiltered SEV of any of the cells 106 in the battery pack; and a filtered SEV curve 610, which is the output of block 318 in FIG. 3 (i.e., $SEV_{KALMAN\_INPUT}$ after it has been filtered using the IIR filter described in respect of block 318 above). The graph 600 shows that the filtered SEV curve 610 has a mean that is similar to the mean of the weakest cell SEV curve 606, indicating that it generally represents the SEV of the weakest cell 106 in the battery pack except with reduced noise. The lowest SEV curve 608 is consistently approximately 40 mV lower than the filtered SEV curve 610, and if relied upon to determine SOC would result in the controller 102 determining the battery pack's SOC to be lower than it actually was; in this example embodiment, an error of approximately 10% in SOC could result from relying on the lowest SEV curve 608 to determine SOC as opposed to the filtered SEV curve 610.

As discussed above, the controller 102 used in the foregoing embodiments may be, for example, a processing unit (such as a processor, microprocessor, or programmable logic controller) communicatively coupled to a non-transitory computer readable medium having stored on it program code for execution by the processing unit. Alternatively, the controller 102 may comprise a microcontroller (which comprises both a processing unit and a non-transitory computer readable medium), field programmable gate array (FPGA), or an application-specific integrated circuit (ASIC). Examples of computer readable media are non-transitory and include disc-based media such as CD-ROMs and DVDs, magnetic media such as hard drives and other forms of magnetic disk storage, semiconductor based media such as flash media, random access memory (including DRAM and SRAM), and read only memory.

It is contemplated that any part of any aspect or embodiment discussed in this specification can be implemented or combined with any part of any other aspect or embodiment discussed in this specification.

FIGS. 2 and 3 are flowcharts of example methods. Some of the blocks illustrated in the flowcharts may be performed in an order other than that which is described. Also, it should be appreciated that not all of the blocks described in the flowcharts are required to be performed, that additional blocks may be added, and that some of the illustrated blocks may be substituted with other blocks.

For the sake of convenience, the example embodiments above are described as various interconnected functional blocks. This is not necessary, however, and there may be cases where these functional blocks are equivalently aggregated into a single logic device, program or operation with unclear boundaries. In any event, the functional blocks can be implemented by themselves, or in combination with other pieces of hardware or software.

While particular embodiments have been described in the foregoing, it is to be understood that other embodiments are possible and are intended to be included herein. It will be clear to any person skilled in the art that modifications of and adjustments to the foregoing embodiments, not shown, are possible.

What is claimed is:

1. A method for iteratively determining state of charge (SOC) of a battery cell in a multi-cell battery comprising multiple battery cells, the method comprising:
   selecting a cell ("selected cell") from the multiple battery cells of the multi-cell battery by:
      using a voltmeter to measure, multiple times during an election period, a cell voltage (SEV) of each of the battery cells; and
      using a controller to determine the selected cell to be the battery cell found most often to have the lowest measured SEV during the election period; and
   using the controller to perform a number of iterations, wherein each of the iterations comprises:
      determining a predicted SOC of the selected cell from an initial SOC value or an SOC of the selected cell determined from performing a previous one of the iterations;
      determining a predicted error covariance of the predicted SOC from an initial error covariance value or an error covariance determined from performing the previous one of the iterations;
      using an ammeter to measure current flowing through the selected cell ("current measurement");
      updating the predicted SOC to determine an updated SOC of the selected cell, wherein updating the predicted SOC comprises adding a weighted correction factor that is determined using the predicted error covariance to the predicted SOC and using a difference between the measured SEV of the selected cell and a predicted SEV of the selected cell, and wherein the weighted correction factor decreases as the magnitude of the current measurement increases and increases as the magnitude of the current measurement decreases; and
      updating the predicted error covariance to determine an updated error covariance.

2. The method of claim 1 wherein the controller repeatedly determines, for each of at least two of the election period, which of the battery cells most often has the lowest measured SEV, and wherein the selected cell is determined from measurements obtained during the election period that has most recently elapsed.

3. The method of claim 1 wherein each of the iterations further comprises using the controller to low-pass filter the measured SEV prior to using it to determine the weighted correction factor.

4. The method of claim 3 wherein an exponentially-weighted infinite impulse response filter is used to low-pass filter the measured SEV.

5. The method of claim 4 wherein the updated error covariance is used to determine the predicted error covariance of a subsequent one of the iterations, wherein $$\Sigma_{e,k+} = \Sigma_{e,k-} \cdot (1 - K \cdot C),$$

$$K = \Sigma_{e,k-} \cdot C^T \cdot S^{-1},$$

$$C = \frac{\partial}{\partial SOC} OCV(SOC_{k,(-)}) - M(SOC_{k,(-)}), \text{ and}$$

$$S = C \cdot \Sigma_{e,k-} \cdot C^T + v_k(I),$$

wherein $\Sigma_{e,k+}$ is the updated error covariance $\Sigma_{e,k-}$ is the predicted error covariance, $$\frac{\partial}{\partial SOC} OCV(SOC_{k,(-)})$$

is the partial derivative of the open circuit voltage of the selected cell at the predicted SOC with respect to the SOC of the selected cell, $M(SOC_{k,(-)})$ is hysteresis of the selected cell at the predicted SOC, and $v_k(I)$ is a measurement covariance, and
   wherein the measurement covariance decreases as the magnitude of the current measurement decreases and increases as the magnitude of the current measurement increases.

6. The method of claim 5 wherein the measurement covariance is of the form $A \cdot I + b$, where A and b are constants and I is the magnitude of the current measurement.

7. The method of claim 5 further comprising using the controller to low-pass filter the measurement covariance prior to using it to determine the updated error covariance.

8. The method of claim 7 wherein an exponentially-weighted infinite impulse response filter is used to low-pass filter the measurement covariance.

9. A system for iteratively determining state of charge (SOC) of a battery cell in a multi-cell battery comprising multiple battery cells, the system comprising:
   a multi-cell battery comprising multiple battery cells;
   voltmeters for measuring a voltage across each of the battery cells;
   an ammeter for measuring a current flowing through each of the battery cells; and
   a controller communicatively coupled to the voltmeters and the ammeter, the controller configured to perform a method comprising:
      selecting a cell ("selected cell") from the multiple battery cells of the multi-cell battery by:
         using the voltmeters to measure, multiple times during an election period, a cell voltage (SEV) of each of the battery cells; and determining the selected cell to be the battery cell found most often to have the lowest measured SEV during the election period; and determining a predicted SOC of the selected cell from an initial SOC value or an SOC of the selected cell determined from performing a previous one of the iterations;

determining a predicted error covariance of the predicted SOC from an initial error covariance value or an error covariance determined from performing the previous one of the iterations;

using the ammeter to measure current flowing through the selected cell ("current measurement");

updating the predicted SOC to determine an updated SOC of the selected cell, wherein updating the predicted SOC comprises adding a weighted correction factor that is determined using the predicted error covariance to the predicted SOC and using a difference between the measured SEV of the selected cell and a predicted SEV of the selected cell, and wherein the weighted correction factor decreases as the magnitude of the current measurement increases and increases as the magnitude of the current measurement decreases; and updating the predicted error covariance to determine an updated error covariance.

10. The system of claim 9 wherein the controller repeatedly determines, for each of at least two of the election period, which of the battery cells most often has the lowest measured SEV, and wherein the selected cell is determined from measurements obtained during the election period that has most recently elapsed.

11. The system of claim 9 wherein each of the iterations further comprises using the controller to low-pass filter the measured SEV prior to using it to determine the weighted correction factor.

12. The system of claim 11 wherein an exponentially-weighted infinite impulse response filter is used to low-pass filter the measured SEV.

13. The system of claim 12 wherein the updated error covariance is used to determine the predicted error covariance of a subsequent one of the iterations, wherein $$\Sigma_{e,k+} = \Sigma_{e,k-} \cdot (1 - K \cdot C),$$

$$K = \Sigma_{e,k-} \cdot C^T \cdot S^{-1},$$

$$C = \frac{\partial}{\partial SOC} OCV(SOC_{k,(-)}) - M(SOC_{k,(-)}), \text{ and}$$

$$S = C \cdot \Sigma_{e,k-} \cdot C^T + v_k(I),$$

wherein $\Sigma_{e,k+}$ is the updated error covariance, $\Sigma_{e,k-}$ is the predicted error covariance, $$\frac{\partial}{\partial SOC} OCV(SOC_{k,(-)})$$

is the partial derivative of the open circuit voltage of the selected cell at the predicted SOC with respect to the SOC of the selected cell, $M(SOC_{k,(-)})$ is hysteresis of the selected cell at the predicted SOC, and $v_k(I)$ is a measurement covariance, and wherein the measurement covariance decreases as the magnitude of the current measurement decreases and increases as the magnitude of the current measurement increases.

14. The system of claim 13 wherein the measurement covariance is of the form A·I+b, where A and b are constants and I is the magnitude of the current measurement.

15. The system of claim 13 further comprising using the controller to low-pass filter the measurement covariance prior to using it to determine the updated error covariance.

16. The system of claim 15 wherein an exponentially-weighted infinite impulse response filter is used to low-pass filter the measurement covariance.

* * * * *